(12) United States Patent
Zierhofer

(10) Patent No.: US 6,727,833 B2
(45) Date of Patent: *Apr. 27, 2004

(54) ADAPTIVE ΣΔ MODULATION WITH ONE-BIT QUANTIZATION

(75) Inventor: Clemens M. Zierhofer, Kundl (AT)

(73) Assignee: MED-EL Elektromedizinische Geraete GmbH, Innsbruck (AT)

( * ) Notice: Subject to any disclaimer, the term of this patent is extended or adjusted under 35 U.S.C. 154(b) by 0 days.

This patent is subject to a terminal disclaimer.

(21) Appl. No.: 10/357,613

(22) Filed: Feb. 4, 2003

(65) Prior Publication Data

US 2003/0146865 A1 Aug. 7, 2003

Related U.S. Application Data

(63) Continuation of application No. 09/496,756, filed on Feb. 3, 2000, now Pat. No. 6,535,153.
(60) Provisional application No. 60/118,607, filed on Feb. 4, 1999.

(51) Int. Cl.[7] ................................................. H03M 3/00
(52) U.S. Cl. ........................ 341/143; 341/76; 341/77; 341/155; 375/242; 375/244; 375/247
(58) Field of Search .............................. 341/76, 77, 143, 341/155; 375/242, 244, 247

(56) References Cited

U.S. PATENT DOCUMENTS

| | | | | |
|---|---|---|---|---|
| 4,940,977 A | * | 7/1990 | Mandell | 341/139 |
| 5,012,245 A | | 4/1991 | Scott et al. | 341/150 |
| 5,027,306 A | | 6/1991 | Dattorro et al. | 364/724 |
| 5,030,952 A | * | 7/1991 | Ledzius et al. | 341/143 |
| 5,144,306 A | * | 9/1992 | Masuda | 341/200 |
| 5,305,004 A | * | 4/1994 | Fattaruso | 341/120 |
| 5,323,157 A | | 6/1994 | Ledzius et al. | 341/143 |
| 5,357,252 A | | 10/1994 | Ledzius et al. | 341/143 |
| 5,408,235 A | | 4/1995 | Doyle et al. | 341/143 |
| 5,549,658 A | | 8/1996 | Shannon et al. | 607/57 |
| 5,601,617 A | | 2/1997 | Loeb et al. | 607/56 |
| 5,626,629 A | | 5/1997 | Faltys et al. | 607/57 |
| 5,959,562 A | * | 9/1999 | Wiesbauer | 341/143 |
| 6,535,153 B1 | * | 3/2003 | Zierhofer | 341/143 |

OTHER PUBLICATIONS

Delta–Sigma Data Converters: Theory, Design and Simulation; Edited by Norsworthy, et al., IEEE Press, New York, NY 1997.

Oversampling Delta–Sigma Data Converters: Theory, Design and Simulation; Edited by Candy, et al.; IEEE Press, New York, NY 1992.

* cited by examiner

*Primary Examiner*—Michael Tokar
*Assistant Examiner*—K Nguyen
(74) *Attorney, Agent, or Firm*—Bromberg & Sunstein LLP

(57) ABSTRACT

An adaptive sigma delta modulator has an input stage, a conventional sigma delta modulator, and adaptation stage, and an output stage. The input stage produces a difference signal representing the difference between an analog input signal and an adaptive signal, the amplitude of the analog input signal being in a first range [−a+a]. The conventional sigma delta modulator produces an intermediate digital output sequence representative of the difference signal, the amplitude of the intermediate digital output sequence being in a second range [−b+b], wherein b<a. The adaptation stage produces the adaptive feedback signal such that the amplitude of the adaptive signal keeps the difference signal within the second range [−b+b]. The output stage produces a final digital output sequence that is the sum of the intermediate digital output sequence and a delayed adaptive feedback signal representative of the adaptive feedback signal delayed by one sampling clock period. The final digital output sequence has an amplitude in the first range [−a+a] and is a digital representation of the analog input signal delayed by one sampling clock period.

6 Claims, 8 Drawing Sheets

ADAPTIVE ΣΔ MODULATION WITH ONE-BIT QUANTIZATION

The present application is a continuation of U.S. application Ser. No. 09/496,756, now U.S. Pat. No. 6,535,153 B2 filed Feb. 3, 2000 which claims priority from U.S. provisional application No. 60/118,607, filed Feb. 4, 1999, both of which are hereby incorporated herein by reference.

FIELD OF THE INVENTION

The invention generally relates to signal processing, and more particularly, to analog to digital conversion using sigma-delta modulation.

BACKGROUND ART

Sigma-delta (Σ-Δ) modulation is a widely used and thoroughly investigated technique for converting an analog signal into a high-frequency digital sequence. See, for example, "Oversampling Delta-Sigma Data Converters," eds. J. C. Candy and G. C. Temes, IEEE Press, 1992, and "Delta-Sigma Data Converters," eds. S. R. Northworthy, R. Schreier, G. C. Temes, IEEE Press, 1997, both of which are hereby incorporated herein by reference.

In Σ-Δ modulation, a low-resolution quantizer is incorporated within a feedback loop configuration in which the sampling frequency is much higher than the Nyquist frequency of the input signal (i.e., much higher than twice the maximum input frequency). In addition, the noise energy introduced in the quantizer is shaped towards higher frequencies according to a so called "noise transfer-function" NTF(z), and the signal passes the modulator more or less unchanged according to a so called "signal-transfer-function" STF(z).

FIG. 1(a) depicts a simple first order Σ-Δ modulator for a discrete time system having a subtraction stage 101, an accumulator 102 (including an integrator adder 103 and a delay line 104), and a one-bit quantizer 105. In normal operation, an input signal $x(n)$ within the range $[-a \leq x(n) \leq a]$ is converted to the binary output sequence $y_a(n) \epsilon \pm a$. The quantizer 105 produces $a+1$ for a positive input and a $-1$ for a negative input. The output from the quantizer 105 is fedback and subtracted from the input signal $x(n)$ by the subtraction stage 101. Thus, the output of the subtraction stage 101 will represent the difference between the input signal $x(n)$ and the quantizer output signal $y_a(n)$. As can be seen from FIG. 1(a), the output of the accumulator 102 represents the sum of its previous input and its previous output. Thus, depending on whether the output of the accumulator 102 is positive or negative, the one-bit quantizer 105 outputs $a+1$ or a $-1$ as appropriate.

As can be seen in FIG. 1(b), if the quantizer 105 is replaced by an adder 106 and a noise source 107 the basic relationship between the z-transforms of system input $x(n)$, quantizer noise $\gamma_a(n)$; and the two-level output sequence $y(n)$ is:

$$Y_a(z) = z^{-1}X(z) + (1-z^{-1})\Gamma_a(z),$$

where index "a" denotes the amplitude of sequence $y_a(n)$, i.e., $y_a(n) \epsilon \pm a$. The signal transfer function and noise transfer function can be identified as $STF(z) = z^{-1}$ and $NTF(z) = (1-z^{-1})$, respectively.

For higher order modulators, the signal transfer unction remains unchanged, and the noise transfer function becomes $NTF(z) = (1-z^{-1})^k$, where k denotes the order of the modulator. The signal-transfer function $STF(z) = z^{-1}$ means that the input signal is represented in the output sequence $y_a(n)$, delayed by one sampling clock period. This transfer function does not contain any bandwidth limitations of the input signal. Any input signal $x(n)$ within the range $[-a+a]$ can be processed by the Σ-Δ modulator, including discontinuous signals with step-like transitions. For the modulator depicted in FIG. 1, this can easily be demonstrated, if it is regarded as a linear (non-adaptive) delta modulator, whose input is the accumulated input $x(n)$. If the input is within the range $[-a \leq x(n) \leq a]$, the magnitude of the maximum slope of the accumulated sequence $x(n)$ is a $a/T$ (with T as sampling period). Thus, the delta modulator can always track its input, and so called "slope-overload conditions" cannot occur.

In most applications, this basic Σ-Δ feature is not exploited. In order to cut off the shaped out-of-band-quantization noise, the Σ-Δ output sequence $y_a(n)$ is low-pass filtered (usually by means of linear filters), thereby removing also the spectral components of $x(n)$ outside the base band.

SUMMARY OF THE INVENTION

An adaptive sigma delta modulator is provided. The adaptive sigma delta modulator includes an input stage, a sigma delta modulator, an adaptation stage, and an output stage. The input stage produces a difference signal representing the difference between an analog input signal in a first amplitude range and an adaptive feedback signal. The sigma delta modulator produces an intermediate digital output sequence in a reduced second amplitude range representative of the difference signal. The adaptation stage produces the adaptive feedback signal such that the amplitude of the adaptive signal keeps the difference signal within the reduced second range. The output stage produces a final digital output sequence which is the sum of the intermediate digital output sequence and a delayed adaptive feedback signal. The final digital output sequence has an amplitude in the first range and is a digital representation of the analog input. In one embodiment, the adaptive feedback signal is delayed by one clock period. The adaptive feedback signal may include an estimate of the instantaneous input signal and the sign of a quantizer output signal multiplied by an amplitude smaller than the amplitude of the input signal. In a preferred embodiment, the sigma delta modulator is of the first order.

In a further embodiment, an adaptive sigma delta modulator is provided wherein the input stage includes a plurality of capacitors connected in parallel and a switch control logic device for charging and discharging the capacitors.

A method for adapting sigma delta modulation is also provided. A difference signal representing the difference between an analog input signal in a first amplitude range and an adaptive feedback signal is produced. An intermediate digital signal output sequence in a reduced second amplitude range representative of the difference signal is also produced. The adaptive feedback signal is produced and the amplitude of the adaptive feedback signal keeps the difference signal within the reduced second range. Lastly, a final digital output sequence is produced. The final digital output sequence is the sum of the intermediate digital output sequence and a delayed adaptive feedback signal representative of the adaptive feedback signal. The final digital output sequence has an amplitude in the first range.

BRIEF DESCRIPTION OF THE DRAWINGS

The present invention will be more readily understood by reference to the following detailed description taken with the accompanying drawings, in which.

DETAILED DESCRIPTION OF SPECIFIC EMBODIMENTS

A method for improving the signal-to-noise ratio (SNR) of sigma-delta (Σ-Δ) modulators with one-bit quantization is presented. The two-level feedback signal of a standard Σ-Δ modulator is replaced by a multilevel signal, which is a superposition of two parts. One part $s(n)$ represents a rough estimate of the instantaneous amplitude of the input signal, and the other $y_b(n)$ is the sign of the quanitzer output, multiplied with constant b, i.e., $y_b(n)=b*y_o(n)$. Compared to a non-adaptive modulator, the amplitude of $y_b(n)$ is reduced. Therefore less noise_power is introduced in the quantizer, and the SNR is considerably enhanced. Signal $s(n)$ is derived numerically from the quantizer output $y_o(n)$ according to a particular adaptation algorithm. Except for the :dc-level of $s(n)$, sequence $y_s(n)$ contains the_full digital information of the modulator input signal. From $y_o(n)$, a digital_multilevel sequence $w_o(n)$ can be calculated, which represents the digital modulator output. The price paid for the improved SNR is a moderate slew rate limitation of_the input signal. The approach is basically suited for a wide class of Σ-Δ modu-lators. Here, simulation results and an example for a practical implementation of an_adaptive Σ-Δ modulator of $1^{st}$ order is presented.

Figure 2:
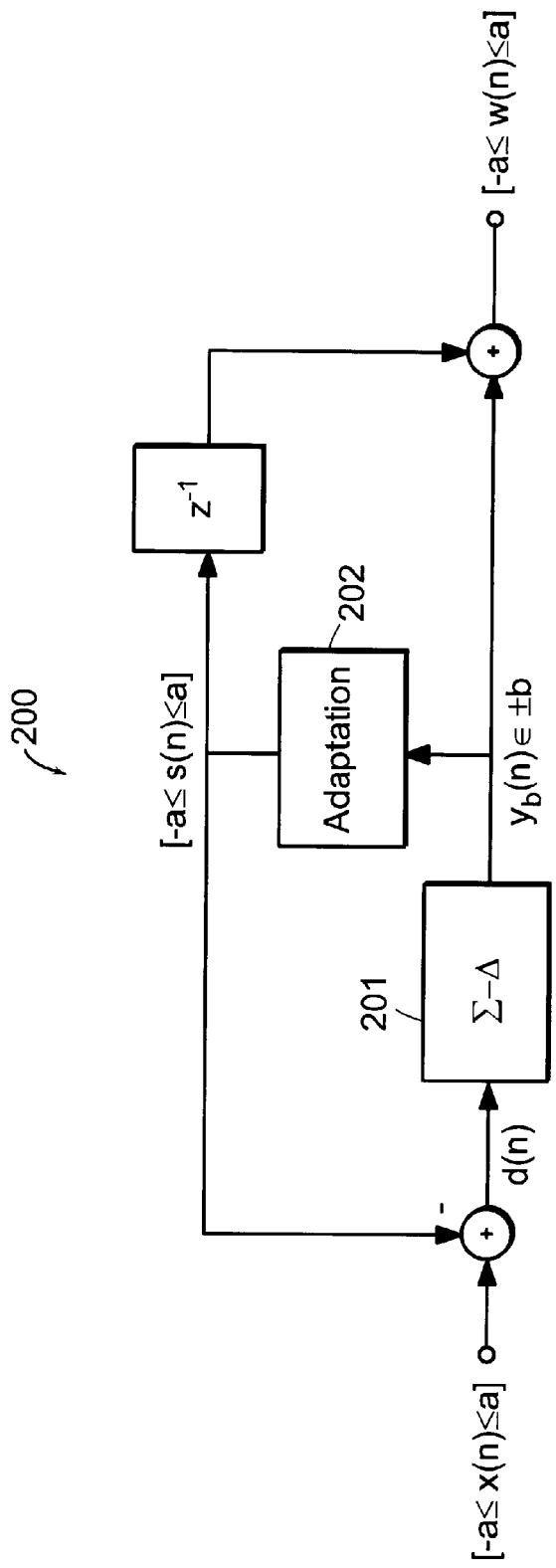
FIG. 2 illustrates the principle of an adaptive Σ-Δ modulator according to a representative embodiment of the present invention.

The idea of the present approach is explained with the help of FIG. 2. It shows a Σ-Δ modulator 201 within a closed loop configuration 200. The input to the modulator 201 is the difference signal $d(n)=x(n)-s(n)$, where $x(n)$ is the system input in the range $[-a+a]$, and signal $s(n)$ is the output of an adaptation stage 202.

The primary intention of the adaptation stage 202 is to ensure that signal $d(n)$ is kept within the reduced range $[-b+b]$, with $b<a$. This is the case, if $s(n)$ is a rough estimate of the instantaneous amplitude of $x(n)$. Signal $d(n)$ can now be digitized with a Σ-Δ modulator operating within the reduced range $[-b+b]$ and thus, only a fraction $b/a$ of quantization noise is introduced in the quantizer as compared to the standard modulator FIG. 1.

The z-transform of sequence $y_b(n)$ is given by:

$$Y_b(z)=z^{-1}(X(z)-S(z))+(1-z^{-1})^k \Gamma_b(z),$$

where $\Gamma_b(Z)$ is the z-transform of the noise $\gamma_b(n)$ introduced in the 1-bit quantizer. The multi-level output $W(z)$ is obtained by adding $z^{-1}S(z)$, i.e., $$W(z)=Y_b(z)+z^{-1}S(z)=z^{-1}X(z)+(1-z^{-1})^k \Gamma_b(z).$$

Figure 1A:
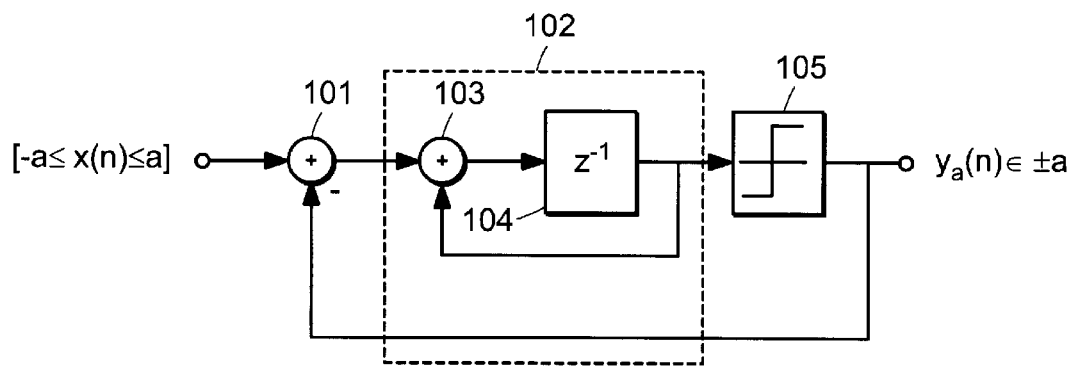
FIG. 1(a) illustrates functional blocks of a first order Σ-Δ modulator for a discrete time system.
Figure 1B:
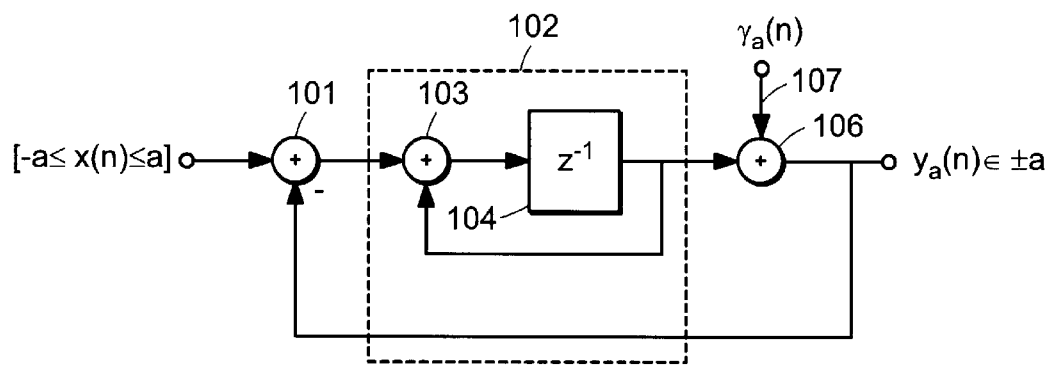
FIG. 1(b) shows the modulator of FIG. 1(a) wherein the quantizer is replaced by an adder and a noise source.

Compared to the modulator of FIG. 1 above, and assuming a system of $1^{st}$ order (k=1), in this approach, signal and noise transfer functions remain unchanged, i.e., $STF(z)=z^{-1}$ and $NTF(z)=(1-z^{-1})$. However, the noise factor here is $\Gamma_b(z)$ instead of $\Gamma_a(z)$, which means a considerable reduction of added quantization noise. A rough expression for the gain in signal-to-noise ratio (SNR) of the adaptive technique as compared to the standard scheme is given by $G=20 \log_{10}(a/b)$.

Figure 3:
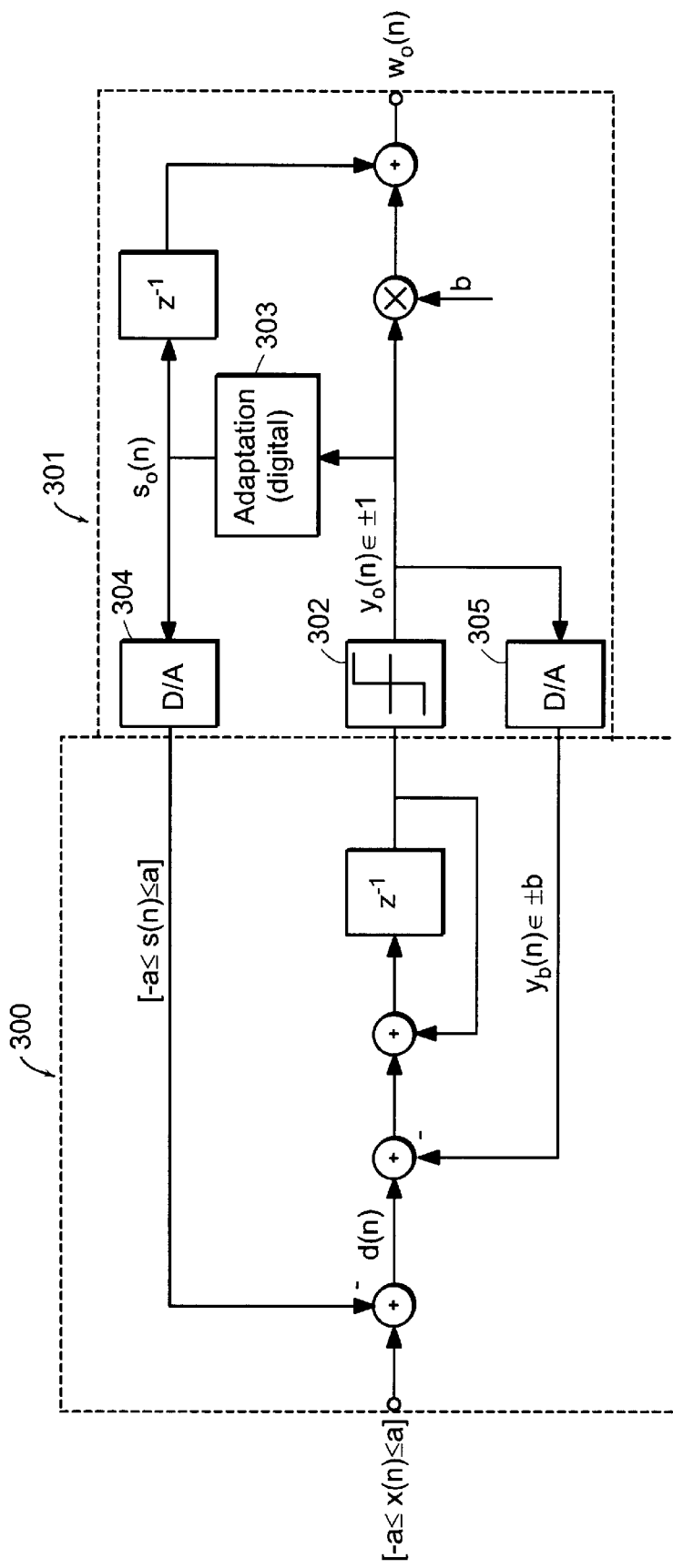
FIG. 3 illustrates functional blocks of a first order adaptive Σ-Δ modulator according to a representative embodiment.

Incorporating the modulator presented in FIG. 1(a) in the loop system depicted in FIG. 2 results in an adaptive Σ-Δ modulator of $1^{st}$ order as shown in FIG. 3. In this plot, analog and digital representations of signals are distinguished from each other. Digital one- or multi-bit signals are labeled with index "0". The system can be separated into an analog section 300 and a digital section 301. The quantizer 302 output $y_o(n) \in \pm 1$ and the adaptation 303 output $s_o(n)$ are converted to the actual feedback signals $y_b(n) \in \pm b$ and $s(n)$ within $[-a+a]$ by means of D/A-converters 304, 305 (note that here for reasons of better clearness two D/A converters are shown; in a practical implementation only one converter is necessary). The system output $w_o(n)$ is obtained by numerically adding signals $s_o(n)$ delayed by one clock period, and sequence $y_o(n)$, which is numerically multiplied by factor b (trivial multiplication, since $y_0(n) \in \pm 1$). The system can also be considered as Σ-Δ modulator of $1^{st}$ order, where the overall signal $s(n)+y_b(n)$ is regarded as an adaptive feedback signal (hence the name "adaptive" Σ-Δ modulator).

Note an interesting difference: in a non-adaptive Σ-Δ modulator, the feedback signal is always an analog version of the digital modulator output. This is a general feature of all non-adaptive Σ-Δ modulators, and is valid also for higher order modulators. For example, in a non-adaptive Σ-Δ modulator of $1^{st}$ order, the analog feedback signal $y_a(n)$ is directly converted from the digital output $y_o(n)$. This is not the case in an adaptive Σ-Δ modulator approach. Here the overall feedback signal is $s(n)+y_b(n)$, which is the analog representation of the digital signal $s_o(n)+by_o(n)$. However, the digital modulator output is $w_o(n)=s_o(n-1)+by_o(n)$, and this delay of $s_o(n)$ is essential for the system performance.

The way the adaptation stage has to work is intuitively clear. Code $y_o(n)$ indicates whether or not signal $d(n)=x(n)-s(n)$ tends to leave the range $[-b+b]$, and signal $s_o(n)$ and signal $s(n)$ are adapted to prevent this case. If the local density of "+1" ("-1") exceeds a particular limit, $s_o(n)$ has to be increased or decreased.

An example for an adaptation algorithm for a system of $1^{st}$ order, which can be easily implemented, is shown in Table 1:

TABLE 1

Adaptation algorithm for a system of $1^{st}$ order (with $0 \leq q \leq 1$)

| Code | | | |
|---|---|---|---|
| $y_0(n)$ | $y_o(n-1)$ | $y_o(n-2)$ | Adaptive feedback signal |
| +1 | +1 | +1 | $s_o(n) = s_o(n-1) + bq$, upper limit: $s_o(n) \leq a - b$ |

TABLE 1-continued

Adaptation algorithm for a system of 1st order (with $0 \leq q \leq 1$)

Code

| $y_0(n)$ | $y_o(n-1)$ | $y_o(n-2)$ | Adaptive feedback signal |
|---|---|---|---|
| −1 | −1 | −1 | $s_o(n) = s_o(n-1) - bq$, lower limit: $s_o(n) \geq -a + b$ |
| Other combinations | | | $s_o(n) = s_o(n-1)$ |

Figure 4:
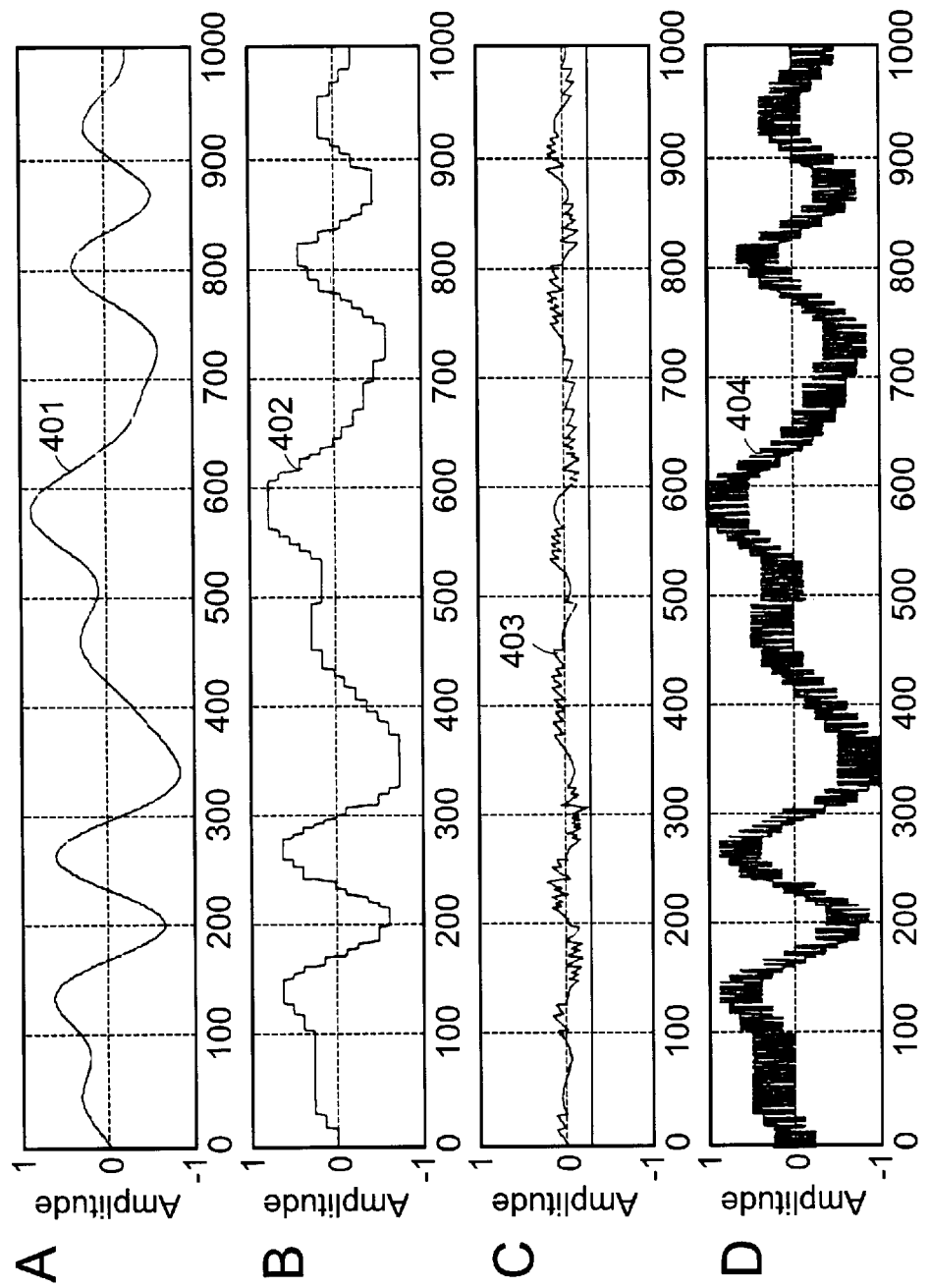
FIG. 4 illustrates typical waveforms of a first order adaptive Σ-Δ modulator in response to a continuous analog input signal.

Signal s(n) is a stair-like signal, where the difference between neighboring samples is +bq, −bq, or zero. Thus, parameter q (within the range $0 \leq q \leq 1$) defines the step size of s(n). Some typical signal wave forms occurring in an adaptive Σ-Δ modulator with the adaptation algorithm of Table 1 are depicted in FIG. 4 for a=1, b=0.25, and q=0.5. Trace 401 depicts a bandwidth-limited input signal x(n), and trace 402 represents the adaptive feedback signal s(n). With the chosen parameters, the step-size of s(n) is bq=0.125. The difference signal d(n), represented by trace 403, is the input of the Σ-Δ modulator operated in range [−0.25+0.25] (the limits −0.25 and +0.25 are shown as straight lines, respectively). The digitally computed system output $w_o(n)$ is shown in trace 404. It can be expected that this multi-level sequence is a considerably better digital representation of the input x(n) as compared to a two-level sequence $y_a(n)$ ϵ±1, which would be obtained with a standard Σ-Δ modulator of $1^{st}$ order.

The exact shape of s(n) (assuming that s(n) is derived from $s_o(n)$ by means of an ideal A/D converter) is not crucial for the functioning of the system. It is only important that d(n) be kept within the limited range [−0.25+0.25], so that it can be processed by the Σ-Δ modulator operated in this range. Furthermore, signal d(n) is clearly not a band-limited signal, but nonetheless, as mentioned above, the Σ-Δ modulator is capable of processing such a discontinuous signal.

If d(n) exceeds the range [−b+b], additional quantization noise is introduced. This condition can be identified as a typical "slope-overload" condition, if the Σ-Δ modulator of $1^{st}$ order is regarded as linear delta modulator of $1^{st}$ order, whose input is the accumulated sequence d(n). Slope overload conditions occur, if the adaptive feedback signal s(n) cannot track the input signal x(n) fast enough. With the adaptation algorithm of Table 1 for a system of $1^{st}$ order, the maximum slope of s(n) is bq/T. Assuming $f_x \ll 1/T$, for a sinusoidal input $x(n) = A \sin(2\pi T f_x n)$, the maximum slope is $A 2\pi f_x$. This results in an absolute maximum input frequency:

$$f_{x,max} = bq/2\pi AT$$

For example, with b,=0.25, q=0.5, A=1, and T=1 μs, the maximum input frequency is $f_{x,max}$=19.89 kHz.

Figure 5:
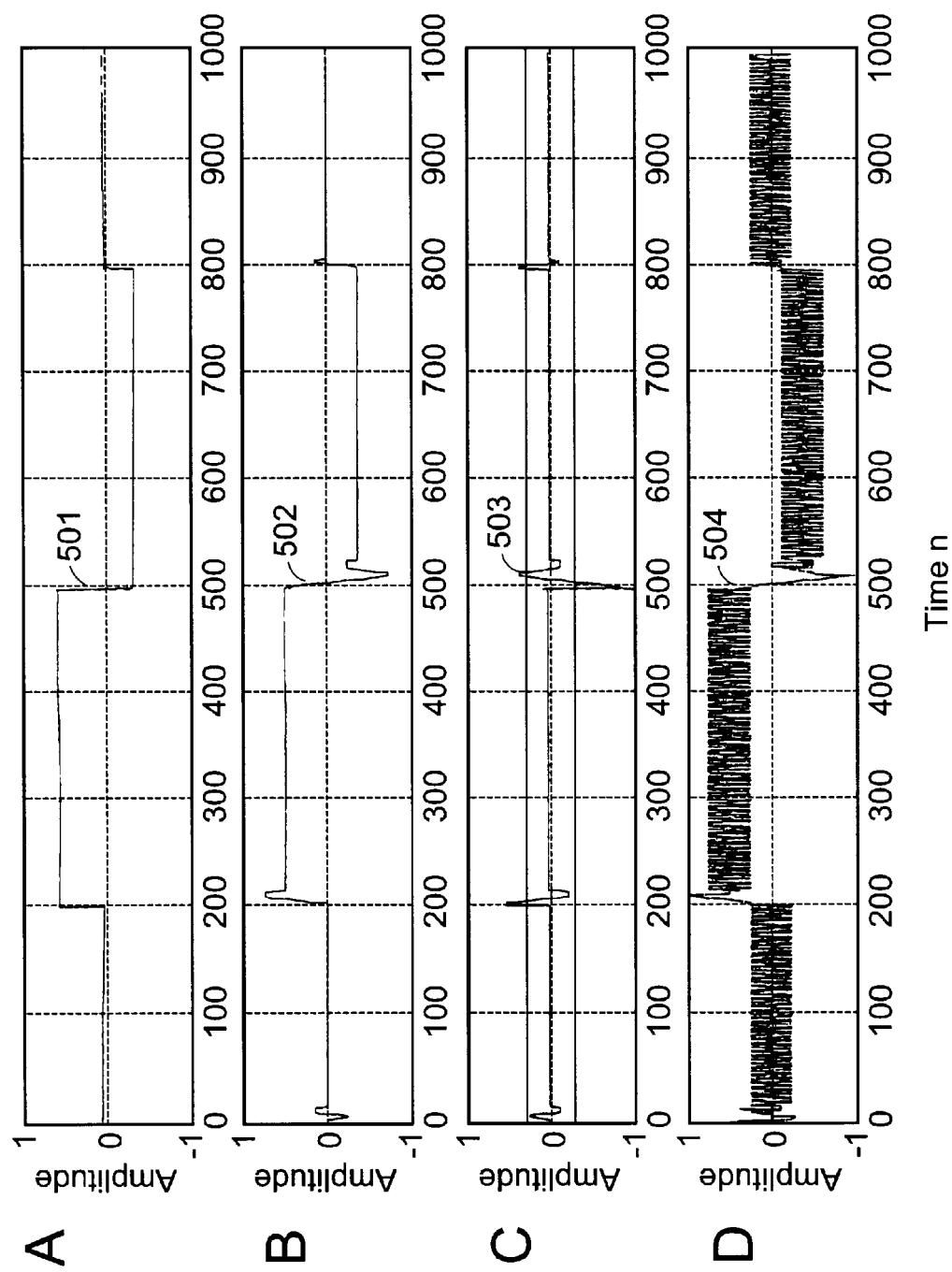
FIG. 5 illustrates typical waveforms of a first order adaptive Σ-Δ modulator in response to a step-like analog input signal.

If the input signal contains slopes steeper than ±bq/T, slope overload noise is introduced. Nevertheless, the system does not show any tendency to fall into unstable operation modes. An example is depicted in FIG. 5, where the input signal x(n) 501 contains step-like transitions. At these positions, signal s(n) 502 tracks x(n) with limited slew rate. However, after few sampling periods, stable conditions are reached. As expected, here signal d(n) exceeds the range [−b+b] 503.

FIG. 5 also illustrates a typical initialization behavior. An arbitrary initial state of s(n) qualitatively corresponds to the case of a step-like transition of x(n). In FIG. 5, the initial condition has been set to s(1)=1−b=0.75, and signal s(n) has adapted within some clock periods.

As shown in the example FIG. 5, signals $s_o(n)$ and s(n) adapt from an arbitrary is initial state within a short time when the adaptation stage is within a closed loop configuration (e.g., when the adaptive Σ-Δ modulator is used as a front-end of an A/D converter). The signals $s_o(n)$ and $y_o(n)$ are directly used to compute $w_o(n)$ 504, and then digital filters for further signal processing (e.g., for decimation) can be applied.

Figure 6:
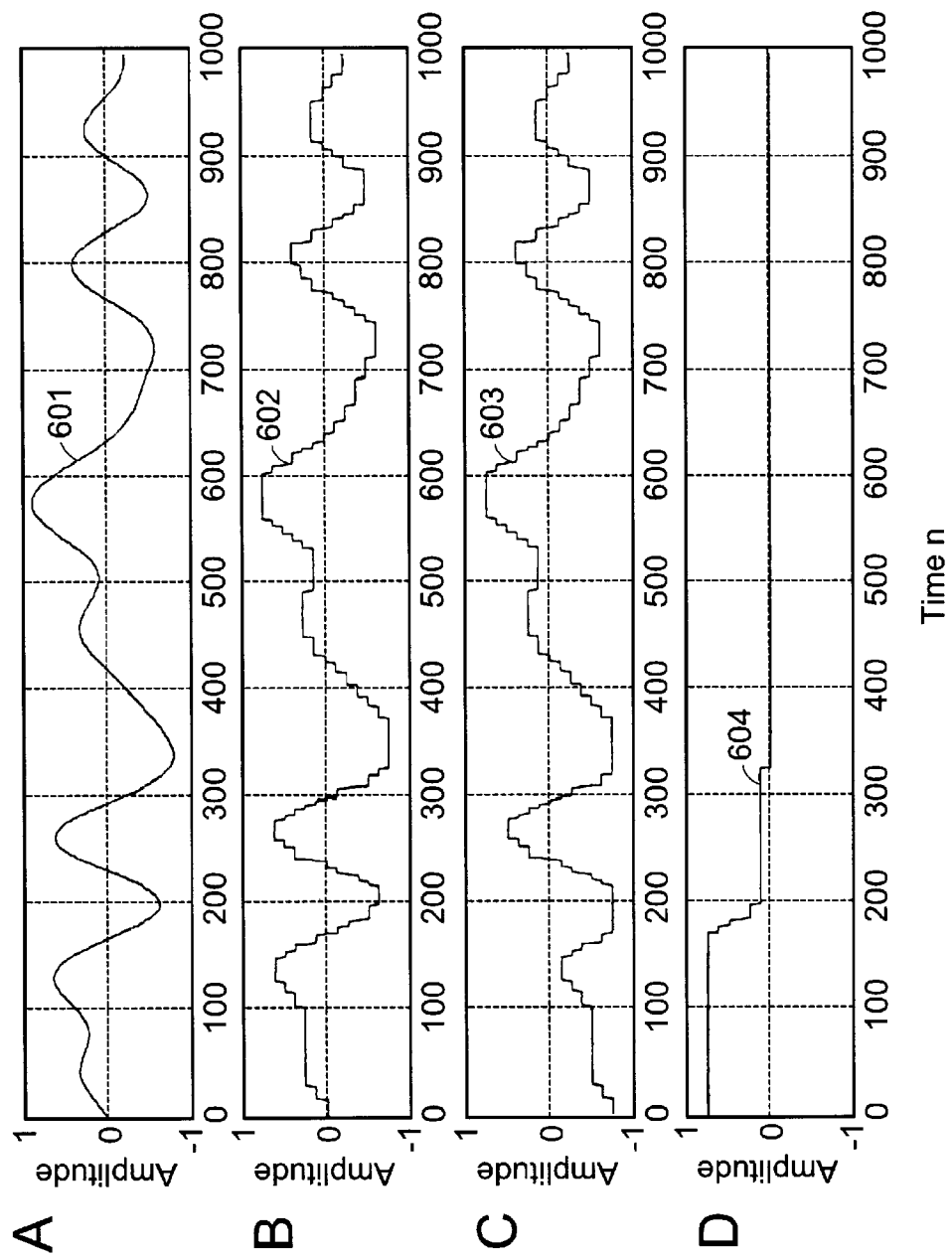
FIG. 6 illustrates additional waveforms of a first order Σ-Δ modulator in response to the input signal of FIG. 4.

However, when $s_o(n)$ has to be reconstructed from sequence $y_o(n)$, and the initial state of $s_o(n)$ is unknown, a principal uncertainty regarding the dc-offset of $s_o(n)$ remains. If $s_o'(n)$ designates the sequence with unknown initial state, then the difference to the correct sequence $s_o(n)$ is reduced each time, $s_0'(n)$ reaches. the limits set by the adaptation algorithm. An example is shown in FIG. 6, where the same input signal and the same adaptation algorithm as in FIG. 4 are used (resulting in trace 601 and trace 602). Trace 603 depicts signal $s_o'(n)$, if it is reconstructed from the binary sequence $y_o(n)$ only, and the initial condition is assumed to be $s_o'(1) = -(1-b)$. As can be seen in trace 604, the difference $s_o(n) - s_o'(n)$ is successively reduced to zero, and the error reduction takes place each time $s_o'(n)$ reaches the limits ±(1−b). When the error has once reached zero, it remains zero.

Figure 7:
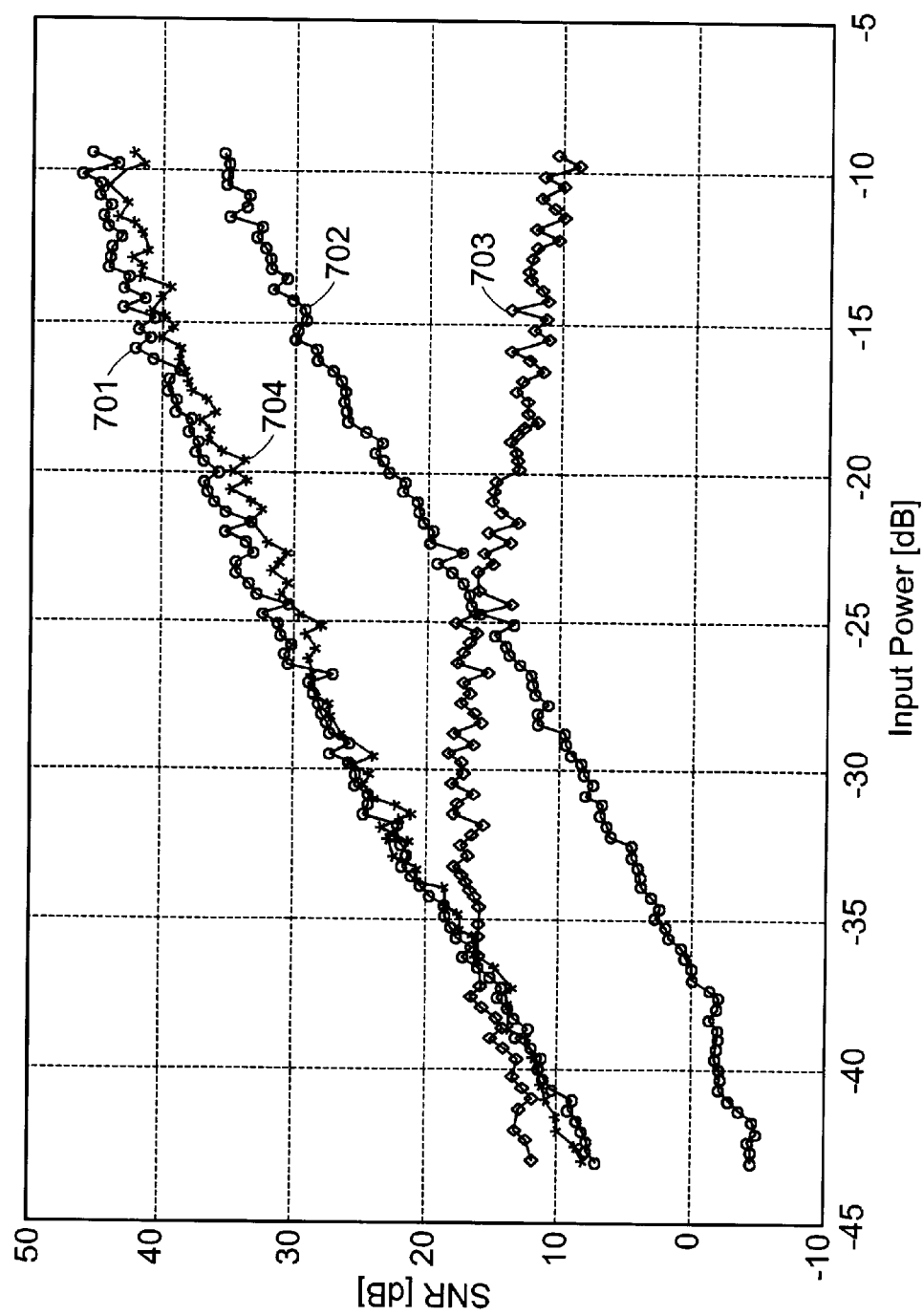
FIG. 7 illustrates signal-to-noise ratios as a function of input signal power with noise input signals.

In FIG. 7, the signal-to-noise ratios (SNRs) of different types of Σ-Δ modulators of $1^{st}$ order are shown as a function of the power of the input signal. The input signal x(n) is a periodic zero-mean noise sequence composed of N=4000 samples, and the bandwidth is B=20 kHz. Within this bandwidth, amplitudes and phases of the spectral lines are randomized. Different values of signal power are obtained by proportional amplification of this signal. The input power is referred to a reference power level of 1, which corresponds to the power of the standard Σ-Δ output sequence with $y_a(n) \epsilon \pm 1$. At the maximum input power level shown in FIG. 7 (i.e., at −9.45 dB), the maximum signal amplitude reaches the value 0.99, which is just below the limit a=1. The calculation of the adaptive Σ-Δ modulators is based on the adaptation, algorithm Table 1, and the system parameters are set to a=1, b=0.25, and q=0.5. For the standard modulator, a=1 is assumed. The sampling rate for all systems is 1/T=1 MHz, and the SNR's are computed within B=20 kHz.

As can be seen from curve 701, the maximum SNR is obtained with an ideal adaptive Σ-Δ modulator. This system is clearly superior to the ideal standard system represented by curve 702. The gain, that is, the difference SNR as shown by curve 703, at an input power of about −30 dB, peaks at about G=18 dB, which is even higher than the gain of 12 dB, as estimated for $$\frac{a}{b} = \frac{1}{0.25} = 4.$$

An adaptive Σ-Δ modulator requires a multibit D/A-converter in the feedback loop, since the feedback signal s(n) is a multilevel signal. With the algorithm of Table 1, 17 equidistant levels within the input region [−a<x(n)<a] are necessary. The requirements with respect to the linearity of this D/A converter must meet the requirements of an enhanced SNR. This is because a non-ideal D/A converter can be regarded as an ideal converter plus a noise source, and in the present application, the transfer function of this additional noise source is $-NTF(z) = -z^{-1}$. Thus, this noise (multiplied with −1) is directly added to the input signal and enhances the noise energy in the base band. In FIG. 7, the SNR of an adaptive Σ-Δ modulator with a non-ideal D/A converter is shown by curve 704, whereby the contribution of the dc-offset error is omitted. The non-ideal D/A converter has a linearity equal to an 8-bit D/A converter with a maximum deviation of ±½ LSB from the ideal levels, i.e., for a =1, the maximum deviation of the 17 levels from the ideal values is ±1/255, respectively. The error is assumed to be uniformly distributed. As demonstrated, the reduction of SNR increases with increasing input power level, and the mean SNR reduction for input levels between −25 dB and −9.45 dB is smaller than 2 dB.

Input signals as for FIG. 7 have been applied to a multibit Σ-Δ modulator of $1^{st}$ order, involving a multibit quantizer and a multibit D/A converter with a quantization step size Δ=0.5, and a sampling rate 1/T=1 MHz. The quantizer shows a "mid-riser" type of transfer function, i.e., possible quantization levels are ±½Δ, ±3/2Δ, . . . The amount of quantization noise power introduced by this type of multibit Σ-Δ modulator should be comparable to the one of an adaptive Σ-Δ modulator of $1^{st}$ order with b=0.25. An ideal multibit Σ-Δ modulator of $1^{st}$ order, and one with non-ideal D/A converter have been examined. As above, the non-ideal D/A converter has a linearity equal to an 8-bit D/A converter within the range [−1 +1], where, the maximum deviation from the ideal levels is ±½ LSB. The results obtained are very close to curves 701 and 704 for the ideal and the non-ideal modulators, respectively. The representation of an input power range as shown in FIG. 7 requires a 3-bit digital output sequence at 1 MHz.

Figure 8:
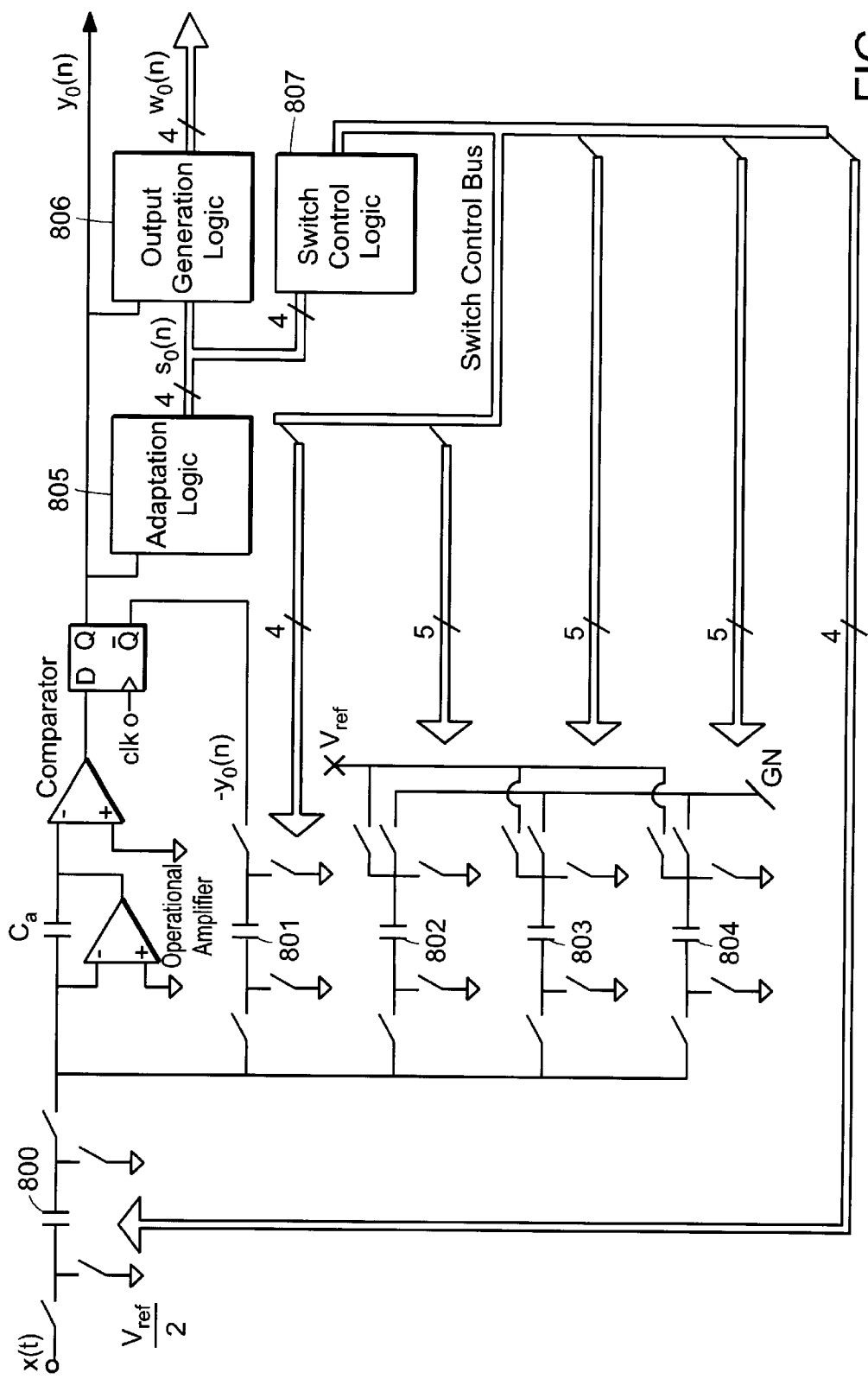
FIG. 8 illustrates a switched capacitor implementation of an adaptive Σ-Δ modulator according to a representative embodiment.

An example for a practical implementation of an adaptive Σ-Δ modulator of $1^{st}$ order implementing the adaptation algorithm of Table 1 is shown in the block diagram FIG. 8. Here, the focus is on the analog part, which is shown as a standard switched-capacitor design. With a=1, b=0.25, and q=0.5, there exist thirteen different, but equally spaced levels for the feedback signal s(n). These levels are ±0.75, ±0.625, ±0.5, ±0.375, ±0.25, ±0.125, and 0. Assuming a reference voltage $V_{ref}$ level 0 is associated with voltage $V_{ref}/2$, levels ±0.125 with voltages $V_{ref}/2$ (1±0.125), etc. In a preferred embodiment, the generation of signal s(n) requires three capacitors 802, 803, 804. For example, 802 may represent C/8, 803 may represent C/4 and 804 may represent C/2 where C is the capacitance of the input capacitor 800. Signal $y_b(n)$ is obtained with the help of capacitor 801 which may represent C/4. The 4-bit signal $s_o(n)$ is derived numerically from signal $y_o(n)$ in the adaptation logic 805. In the output generation logic 806, the 4-bit digital output sequence $w_o(n)$ is calculated by adding sequences $s_o(n-1)$ and $y_o(n)*0.25$. The switching control signals for charging/discharging the capacitors are derived from $s_o(n)$ the switch control logic 807.

In a standard Σ-Δ modulator of $1^{st}$ order with the same input range a=1, the feedback signal would be $y_a(n)$, and the realization from $y_o(n)$ would require a capacitor $C_1=C$. Thus, the additional hardware cost for the adaptive modulator as compared to the standard modulator are three capacitors (plus the associated analog switches), and the logic stages. There are no additional demands on the specifications of the operational amplifier and the comparator, such as slew rate or open loop gain. However, as mentioned above, the precision of the feedback signal has to be meet particular requirements. The realization of 17 quantization levels with a maximum level error of ±1/255 (corresponding to an 8-bit DAC with maximum error of ±½ LSB) should be feasible with standard switched capacitor technology, and thus only a slight reduction of the SNR has to be expected. The power consumption due to the feedback capacitors is even lower in the adaptive than in the non-adaptive-modulator, since the power of the overall feedback signal $s(n)+y_b(n)$ is smaller than the power of signal $y_a(n)$.

To summarize the principal of the invention, the performance of Σ-Δ modulators with respect to signal-to-noise ratio can be significantly improved at the cost of a moderate slew rate limitation of the input signal. This improvement is made possible by the ability of standard Σ-Δ modulators to process discontinuous input signals, i.e., the digital high-rate output signal contains the information of discontinuous input signals. This capability is usually not exploited, because in order to remove the shaped quantization noise, digital filters need to be employed, which also remove the high-frequency components of the input signal.

The quantization stage of the standard Σ-Δ modulator need not to be changed, i.e., the resolution of the quantizer remains the same. However, the feedback signal is a multilevel sequence, and thus a multibit D/A converter in the feedback loop with particular demands on the linearity may be added. The properties of analog components such as operational amplifiers and comparators can be left unchanged.

The power consumption of an adaptive modulator compared to a non-adaptive modulator remains almost the same, and except for the dc-value of $s_o(n)$, the entire digital-information characterizing the input signal x(n) is contained in the 2-level sequence $y_o(n)$. However, the actual signal x(n) (delayed by one sampling period) as a temporal waveform is contained in the multilevel sequence $w_o(n)$, which has to be reconstructed from $y_o(n)$. If the initial value of $s_o(n)$ is known, the digital multilevel sequence $w_o(n)$ can be reconstructed without error directly from $y_o(n)$.

If an adaptive Σ-Δ modulator is compared to a multibit-Σ-Δ modulator with similar SNR-performance at the same sampling rate, two advantages are involved. First, the multibit-quantizer can be omitted. Although there are only modest requirements with respect to the accuracy of multibit A/D-converters in Σ-Δ applications (because of differentiation of the introduced noise), the implementation requires several comparators that contribute to both chip size and power consumption. The second advantage is that the information characterizing the input signal is contained in the single-bit sequence $y_o(n)$ in the adaptive Σ-Δ modulator, instead of in a multibit sequence as for the multibit Σ-Δ modulator. According to information theory this means a significant compression of information per bit. In applications, where the high-rate digital Σ-Δ information has to be stored or transmitted before further processing, this feature can be extremely advantageous with respect to memory size or bandwidth of the transmission channel, respectively.

Although various exemplary embodiments of the invention have been disclosed, it should be apparent to those skilled in the art that various changes and modifications can be made which will achieve some of the advantages of the invention without departing from the true scope of the invention.

What is claimed is:

1. An adaptive sigma delta modulator comprising:

an input stage that produces a difference signal representing the difference between an analog input signal and an adaptive feedback signal, the amplitude of the analog input signal being in a first range [−a+a];

a sigma delta modulator producing an intermediate digital output sequence representative of the difference signal, the amplitude of the intermediate digital output sequence being in a second range [−b+b], wherein b<a;

an adaptation stage that produces the adaptive feedback signal such that the amplitude of the adaptive feedback signal keeps the difference signal within the second range [−b+b]; and an output stage that produces a final digital output sequence as a function of the intermediate digital output sequence and the adaptive feedback signal.

2. An adaptive sigma delta modulator according to claim 1, wherein the adaptive feedback signal comprises:

an estimate of the instantaneous input signal; and the sign of a quantizer output signal multiplied by an amplitude smaller than the amplitude of the input signal.

3. An adaptive sigma delta modulator according to claim 1, wherein the sigma delta modulator is of the first order.

4. An adaptive sigma delta modulator according to claim 1, wherein the sigma delta modulator is multi-ordered.

5. An adaptive sigma delta modulator according to claim 1, wherein the analog input signal is discontinuous.

6. An adaptive sigma delta modulator according to claim 1, wherein the final digital output sequence is a digital representation of the analog input.

* * * * *